(12) United States Patent
Yamada et al.

(10) Patent No.: US 9,405,184 B2
(45) Date of Patent: Aug. 2, 2016

(54) PELLICLE FOR EUV, AND AN ASSEMBLY INCLUDING THE PELLICLE, AND A METHOD FOR ASSEMBLING THE SAME

(71) Applicant: SHIN-ETSU CHEMICAL CO., LTD., Tokyo (JP)

(72) Inventors: Motoyuki Yamada, Annaka (JP); Shoji Akiyama, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 54 days.

(21) Appl. No.: 14/598,616

(22) Filed: Jan. 16, 2015

(65) Prior Publication Data

US 2015/0205193 A1    Jul. 23, 2015

(30) Foreign Application Priority Data

Jan. 20, 2014 (JP) .................................. 2014-007641
Dec. 17, 2014 (JP) .................................. 2014-255102

(51) Int. Cl.
*G03F 1/24* (2012.01)
*G03F 1/62* (2012.01)
*G03F 1/64* (2012.01)
*G03F 1/00* (2012.01)

(52) U.S. Cl.
CPC  *G03F 1/24* (2013.01); *G03F 1/142* (2013.01); *G03F 1/62* (2013.01); *G03F 1/64* (2013.01)

(58) Field of Classification Search
CPC ................ G03F 1/24; G03F 1/62; G03F 1/64
USPC .............................................................. 430/5
See application file for complete search history.

(56) References Cited

U.S. PATENT DOCUMENTS

2008/0259291 A1*  10/2008  Banine .................... G03F 1/84
                                                              355/30

OTHER PUBLICATIONS

Extended European Search Report dated Jun. 5, 2015, issued in counterpart European Patent Application No. 15151391.8 (7 pages).
Extended European Search Report dated May 21, 2015, issued in counterpart European Patent Application No. 14192204.7 (8 pages).

* cited by examiner

*Primary Examiner* — Stephen Rosasco
(74) *Attorney, Agent, or Firm* — Westerman, Hattori, Daniels & Adrian, LLP

(57) ABSTRACT

Here are disclosed a pellicle for EUV and an assembly made up of this pellicle and a mask, which brings about a projection of low contrast (intensity) shadows of a mesh structure on the mask, thus minimizing the adverse effect of the shadow on the lithographic printing; also a method for assembling such assembly is disclosed wherein the pellicle is rotated relative to the mask to minimize the shadow contrast, in terms of a contrast ratio, of the mesh structure; the angle of the rotation is 30 degrees or smaller, and the resultant contrast ratio should be 25% or lower.

7 Claims, 5 Drawing Sheets

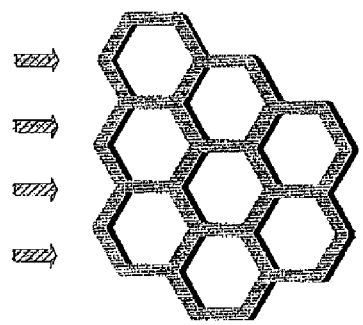
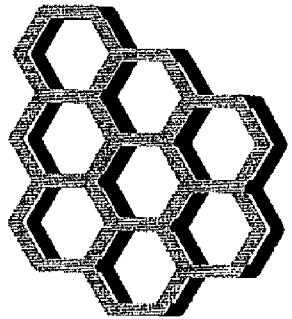
Fig. 1(a)　　　　Fig. 1(b)
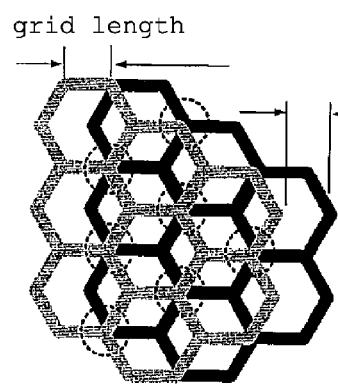
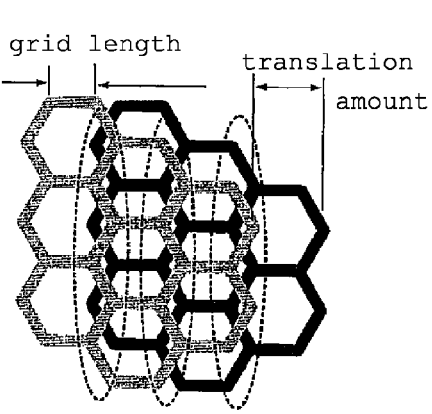
Fig. 1(c)　　　　Fig. 1(d)

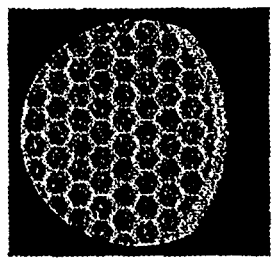 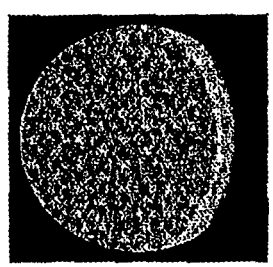 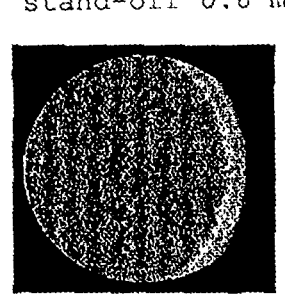
Fig. 2 (a)   Fig. 2 (b)   Fig. 2 (c)
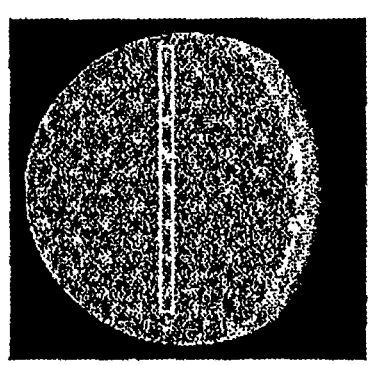 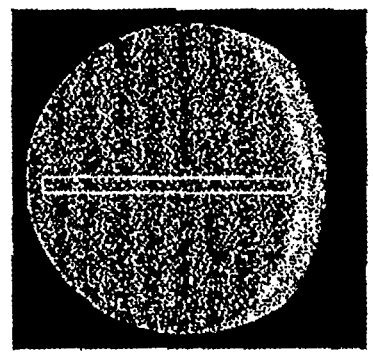
Fig. 3   Fig. 4
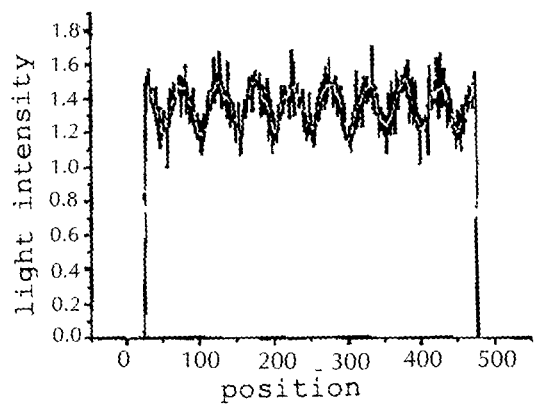
Fig. 5

PELLICLE FOR EUV, AND AN ASSEMBLY INCLUDING THE PELLICLE, AND A METHOD FOR ASSEMBLING THE SAME

The present non-provisional patent application claims priority, as per Paris Convention, from Japanese Patent Application No. 2014-007641 filed on 2014 Jan. 20, and from Japanese Patent Application No. 2014-255102 filed on 2014 Dec. 17, the disclosures of which are hereby incorporated by reference herein in its entirety.

FIELD OF THE INVENTION

The present invention relates to a pellicle for EUV (Extreme Ultra Violet), and in particular to a pellicle for EUV having a capability of attenuating the difference in shade intensity of an image of a mesh structure which is projected on a wafer; the invention also relates to an assembly including such a pellicle and a method of assembling the same.

BACKGROUND TECHNOLOGY

As heightening in integration and densification of semiconductor devices has been furthered, a lithographic patterning on the level of 45 nm is now being realized. Such pattering can be effectively achieved by improved technologies such as immersion exposure method and double exposure method, which use ArF instead of conventional excimer light. However, to cope with a next-generation patterning on the level of 32 nm or even thinner, the exposure technology depending on excimer light falls short, and an EUV exposure technology, which uses EUV light of which the main wavelength is 13.5 nm, far shorter than that of the excimer light, is hoped to be the solution.

Although quite an improvement has been made toward realization of this EUV exposure technology, there remain many technical problems to be solved with respect to light source, resist, pellicle, etc. For example, with regard to the pellicle used to prevent adhesion of a foreign matter to a photomask, which is a phenomenon that lowers production yield, there are various unsolved problems, and thus the pellicle poses a big obstacle against the realization of EUV exposure technology. An especially difficult problem lies in that there has not been a clear roadmap toward realizing a development of a material to make the transparent film of the pellicle that does not age with oxidation or the like and is thus chemically stable, in addition to having a high transmittance of EUV light.

To pass as a good material to make such a pellicle film for EUV, conventional materials have diverse problems, and in particular organic substances do not effectively pass an EUV light and are decomposed and degraded by the EUV light. Although there exists no material that has a perfect transparency to the wavelength range of EUV light, there are disclosed silicon thin films as relatively transparent films for EUV light (ref. IP Publication 1 and non-IP Publication 1).

These silicon films for EUV application are desired to be as thin as possible in view of reducing the attenuation of EUV light; however, these silicon thin films, which are made up of a silicon membrane of 20 nm thickness and a rubidium layer of 15 nm thickness, have thicknesses on nanometer order, so that they are physically very fragile and cannot stand on its own as a pellicle film for EUV.

For this reason, in order to solve this difficulty inherent to using such silicon thin film as a pellicle film for EUV, there has been proposed a use of a structure which has a honeycomb-like shape and has openings adapted to pass EUV light and which is adhered to the extremely thin silicon film to reinforce it. For example, there is proposed a pellicle for EUV which utilizes an SOI (silicon on insulator), and this pellicle has a meshed honeycomb-like structure for reinforcement of the pellicle membrane for EUV (IP Publication 2).

As a mesh structure for reinforcement of the pellicle film for EUV, one can choose from various configurations besides the above-mentioned honeycomb-like structure so long as the intended purpose is met, such as a square or rectangular lattice structure, a plate body having openings in an arbitrary shape such as circle and polygon. The strength of the structure is determined by mesh pitch, width of the thin grid frame defining each mesh opening, and height (thickness) of the frame; and the strength of the structure is greater with narrower pitch, greater width of the grid frame and greater height of the grid frame.

Since this mesh structure does not pass EUV light except through its openings, the opening ratio of the mesh structure ought to be increased in order that the attenuation of the incoming EUV light is minimized. However, the strength of the pellicle film for EUV and the opening ratio of the mesh structure are in a trade off relationship, so that the higher the strength of the pellicle film is, the lower the opening ratio and thus the transmittance become, and as a result, the opening ratio of the mesh structure has to be compromised in designing to meet the operation conditions and restrictions.

The pellicle for EUV as reinforced by such mesh structure is used in an EUV exposure machine as shown in FIG. 10 so as to isolate the pattern area of the mask from the dust and particles. Incidentally, a typical mask is rectangular having straight side lines. In this EUV exposure machine, the EUV light that is emitted from the light source 1 in the stepper enters and passes through the pellicle 2 with an incidence angle of 4-8 degrees as an illumination light and reaches the mask 3. The EUV light that has reached the mask 3 is reflected by the mask 3 and passes the pellicle 2 for the second time, and then enters the optical system 4 and forms an image on the wafer 5.

Now, the EUV light shot from the light source 1 passes through the pellicle 2 twice, as it goes to the mask 3 and reflects therefrom, before it transfers the pattern on the mask 3 to the wafer 5. On this occasion, if the pellicle 2 is reinforced by the mesh structure, as described above, a part of the EUV light is intercepted by the mesh structure, which is impermeable to the EUV light, with a result that the image of the mesh structure is cast on the wafer 5 and this would adversely affects the exposing operation.

PRIOR ART PUBLICATIONS

IP Publications

[IP Publication 1] U.S. Pat. No. 6,623,893
[IP Publication 2] Japanese Patent Application Publication 2010-256434

Non-IP Publications

[Non-IP Publication 1]
Shroff et al. "EUV pellicle Development for Mask Defect Control," Emerging Lithographic Technologies X, Proc of SPIE VOL. 6151 p. 1-10 (2006)

SUMMARY OF THE INVENTION

Problems the Invention Seeks to Solve

It is therefore an object of the present invention among others to provide a pellicle for EUV, or an assembly comprising such a pellicle, which is capable of lowering the shade intensity (contrast) of the image of the mesh structure, as it is cast on the wafer;

Now, a pellicle 2 for EUV is constituted by: (i) a pellicle membrane structure comprising a pellicle membrane and a mesh structure backing the former for preventing the dust and particles from reaching the pattern area of the mask 3, and (ii) a pellicle frame for holding the pellicle membrane structure. Although it is not so shown in FIG. 10, this pellicle membrane structure is normally supported on one end face of the pellicle frame while the other end face thereof is fixed on the face of the mask 3 which carries the pattern.

Therefore, when such a pellicle for EUV is arranged on the optical path, the pellicle membrane structure and the pattern-carrying surface of the mask 3 are properly spaced from each other by the height of the pellicle frame. We will call this spaced distance a "stand-off" and this becomes smaller when the height of the pellicle frame is decreased, and lager when it is increased.

In the case of a general EUV exposure machine, the optical system 4 is designed such that the image of the pattern on the mask 3 is precisely projected on the wafer 5 so that the pattern image on the mask 3 is precisely, if reduced, formed on the wafer 5. As the optical system 4 is so assembled that the plane of the wafer 5 is at the focal distance from the pattern-carrying face of the mask 3 so that any object that is not on the pattern-carrying face of the mask 3 is off the focal distance and hence the pellicle membrane structure comprising the pellicle membrane and the mesh structure can cast only blurred and imageless shade on the wafer 5.

Here, the "blurred and imageless" means that the contour of the pellicle membrane structure is not decipherable on the wafer 5 because the shade is itself weak and the lights that get into the shade deprive what little appearance the shade has had. Hence as the degree of the blur is increased, the intensity of the shade of the pellicle membrane structure diminishes, so that when the blur extent is sufficiently great, the shade of the pellicle membrane structure becomes so imageless that it is virtually unobservable.

If an EUV light is one having a high coherency, the shade of the pellicle membrane structure transmitted on the wafer would be a less blurred and thus more intensified one; however, the illumination light of an exposure machine is generally a light with a lower coherency, and in fact it is a light with incident angles ranging from 4 through 8 degrees off the normal line to the patterned face of the mask 3, so that the light gets into the shade of the pellicle membrane structure with a result that the image formed would on the wafer 5 be a blurred weak one.

Now, the present inventors focused their attention upon this blur phenomenon, and thought that if the blur extent of the shade of the mesh structure constituting the pellicle membrane structure is increased, the intensity of the shade of this mesh structure is lowered and would show more weakly on the face of the wafer 5; thus they continued the study in order to find ways to lower the shade intensity of the mesh structure, and they came to realize that there exists a certain relationship between the stand-off and the shade strength (intensity) of the mesh structure, which would be one of the causes to determine the blur extent. Eventually, they concluded that it is possible to weaken the shade intensity of the two kinds of image shadow of the mesh structure which form on the wafer by controlling a phase-angular position of the mesh structure relative to the mask and the stand-off in a certain way, and hence possessed the invention.

Means to Solve the Problems

Therefore, the present invention relates to a pellicle for EUV which comprises: (i) a pellicle membrane structure having a pellicle membrane and a mesh structure, the latter reinforcing the former, and (ii) a pellicle frame for holding the pellicle membrane structure, the mesh structure being disposed to be projected in two kinds of image shadow on the wafer on account of EUV light's passing the EUV pellicle twice as it reflects on the pattern-carrying face of the mask; wherein a stand-off of the pellicle is of such a magnitude as to allow the contrast ratio between the two kinds of image shadow of the mesh structure to be 25% or lower. A favorable value to attain this is 0.3-1.0 mm.

Also, the present invention is about an assembly combining a mask having side lines and the pellicle for EUV which is as described in the immediately preceding paragraph, wherein a grid of said mesh structure forms an angle, in projection, of greater than 0 degree but not greater than 30 degrees with at least one of the side lines of said mask. In other words, the pellicle with the mesh structure, which is parallel to the mask, has a particular phase-angular position relative to the mask, that is to say, the pellicle is rotated a little so that the mesh orientation is inclined relative to a mask's side line by an angle (herein also referred to as a "honeycomb angle"), and a favorable angle is 30 degrees or smaller but not zero, and the stand-off of the mesh structure and the said phase-angular position are preferably such that the contrast ratio becomes a minimum.

This honeycomb angle which is projected on the wafer is preferably such that the contrast ratio, with respect to the already fixed stand-off allowing 20% or lower contrast ratio, becomes minimum; and it is the most favorable to arrange that stand-off and the honeycomb angle are of such values that the resultant contrast ratio becomes as low as it can be. As for the mesh structure of the present invention, it is preferable that each mesh unit constituting the mesh structure is a quadrilateral or hexagonal frame.

The invention also is directed to a method for assembling such an assembly wherein the steps of the method include (a) providing such a stand-off to the pellicle that allows the contrast ratio between the two kinds of image shadow of the mesh structure to be 25% or lower and (b) moving the pellicle relative to the mask until a grid of the mesh structure forms an angle, in projection, of greater than 0 but not greater than 30 degrees, with a side line of the mask whereat the contrast ratio becomes minimum.

Effects of the Invention

According to the present invention, it is possible to reduce the contrast ratio between the two kinds of image shadow of the mesh structure, so that it is now possible to attain a uniform light exposure with uniform shade intensity all over the light exposure area during the light exposure operation.

BRIEF DESCRIPTION OF DRAWINGS

FIGS. 1 (*a*)-(*d*) are schematic drawings showing the image shadows of a mesh structure.

FIGS. 2 (*a*)-(*c*) are optical images of mesh structures in the cases where the stand-off is 0.1-0.8 mm.

FIG. 3 is a drawing to show from where a digital light intensity datum is collected from a dotted image.

FIG. 4 is a drawing to show from where a digital light intensity datum is collected from a striped image.

FIG. 5 is a graph plotting the relations between the light intensity and the positions from which the light intensity data were collected as shown in FIG. 3 or FIG. 4.

EXAMPLE TO EMBODY THE INVENTION

Figure 6:
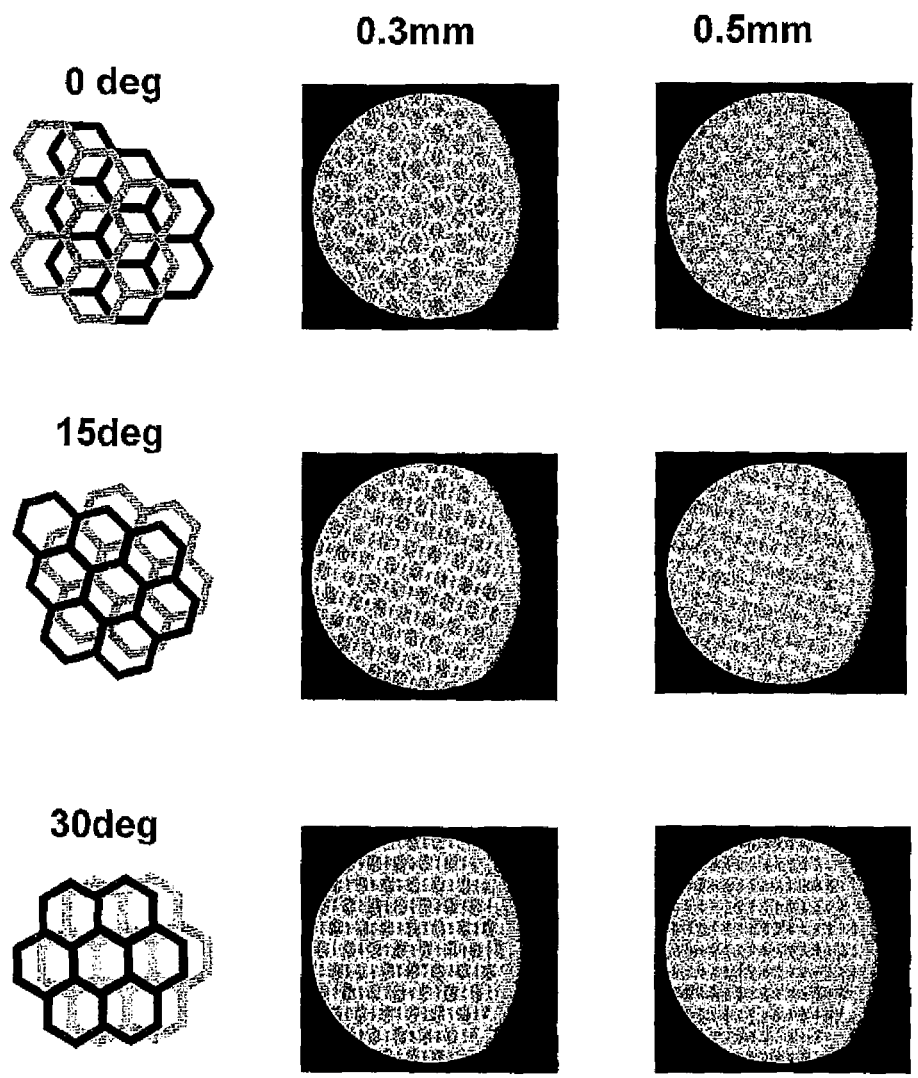
FIG. 6 shows schematic drawings of the mesh structure where the honeycomb angle is respectively 0 or 15 or 30 degrees, and respective dotted or striped images of them.

We will now explain one embodiment of the present invention, but the invention shall not be construed to be limited by this embodiment.

Herein-below, for the purpose of an EUV pellicle having the pellicle membrane structure of the present invention, "stand-off (value)" shall mean the distance between the mask 3 and the mesh structure 2. Therefore a stand-off value of zero means that the mask 3 carrying the pattern image and the mesh structure 2 are in contact with each other. In this situation the image shadow of the mesh structure becomes a shadow having an intensified contrast, meaning that the two kinds of the shadow, namely, the shadow of the incident light and that of the reflected light overlap entirely on each other. If a stand-off is provided to this situation, that is, if a distance is created between the pellicle membrane structure 2 and the mask 3, the shadow of the mesh structure is separated into the shadow of the mesh structure caused by the incident light and that caused by the reflected light, so that the intensity of the shadow contrast is reduced. This kind of phenomenon occurs when the incident light enters at an angle with respect to the normal of the mask 3, and the reflected light reflects at the same angle with respect to the normal thereof.

The direction in which the image shade of the mesh structure caused by the incident light and the image shade of the mesh structure caused by the reflected light translate from each other is determined by the direction of the incident light which is emitted from the light source toward the pellicle. As shown in FIGS. 1 (a) and 1 (b), as the incident light comes in the direction of the arrows, the two kinds of the image shadow of the mesh structure projected on the wafer 5 are translated from each other in the direction of the incident light by virtue of the stand-off. The amount of the translation increases with the amount of the stand-off, as is shown, in the increasing order, by Fig. (a), FIG. 1 (b), FIG. 1 (c) and FIG. 1 (d), and the geometry of this translation phenomenon is also as shown in these four figures of FIG. 1. Furthermore, the translation amount and the geometrical relations between the two kinds of the image shadow recur as the stand-off is increased. Incidentally the degree of defocus (blur) is not represented in FIG. 1 (a) through FIG. 1 (d).

In FIG. 1 (c), the dotted circles indicate where juncture point of the image shadow by incident light overlaps with that of the image shadow by reflected light, and there are seven of them indicated and it is understood that these seven overlaps are where the image shadow has higher intensity of contrast. When the stand-off is further increased, bar portion of the image shadow by incident light is seen to overlap with that of the image shadow by reflected light, as indicated by dotted ovals in FIG. 1 (d), and it is understood that this kind of overlap creates a belt-like shadow which also has a higher intensity of contrast.

The present inventors investigated in the relationship between the parts where the shadow density increases owing to the overlap of the image shadows, shown in FIG. 1 (c) and FIG. 1 (d), on one hand and the actual image shadow of the mesh structure on the other, using virtual optical images on an optical simulator; and they confirmed that there actually occur such highly contrasted parts in the image shadows of FIGS. 1 (d) through (d).

In this optical simulation, the inventors created a light passage involving an optical source 1, a pellicle 2, a mask 3 having side lines, an optical system 4 and a wafer 5; then in this optical path, the EUV pellicle having a honeycomb-like mesh structure of a mesh pitch of 200 micrometers and a grid bar width of 3 micrometers was placed on the pattern-less mask 3 with a specified amount of stand-off, and the incident angle of the EUV light was set to 6 degrees and the diversion angle of the incident light was set to 3.8 degrees, and as such the simulation was carried out on the computer.

FIGS. 2 (a) through (c) show parts of optical images obtained by this simulation, and white areas are where intensity of light was great and dark areas are where the intensity of light was small. From FIG. 2, it was firmly confirmed that there certainly is an effect of the incident light which was intercepted by the mesh structure reflected on the projected image.

Incidentally, in this simulator was employed Light Tools manufactured by Optical Research Associate, and dioptric system was adopted as the projection optical system, which was in equivalence to catoptric system.

In the case of FIG. 2 (a) where the stand-off was 0.1 mm, the extent of blurring was so low that the shade of the mesh structure was observed to have a clear honeycomb pattern. In the case of FIG. 2 (b) where the stand-off was 0.5 mm, the pattern was observed to have spots, and in the case of FIG. 2 (c) where the stand-off was 0.8 mm, vertical stripes were observed in the projected pattern.

These spots and the stripes are geometrically coincident with the honeycomb structures of FIG. 1 (c) and FIG. 1 (d), respectively. In other words, it is confirmed that the overlapping of the juncture points of the honeycomb shadows of FIG. 1 (c) creates the spots of FIG. 2 (b), and the bar portions of FIG. 1 (d) are projected as the stripes in FIG. 2 (c). Thus the inventors calculated to obtain the honeycomb length values that bring about the situations of FIG. 1 (c) and FIG. 1 (d), and the answers were 0.55 mm and 0.82 mm, respectively, so that the result of the simulation was confirmed to represent the real situations.

This means that the patterns in FIG. 1, which were geometrically presumed, were, in truth, virtually the same as those that would occur in the actual exposure machine; and it also means that it is possible to predict from the stand-off value whether or not a spotted patter or a striped pattern would appear in the projected shadow of the mesh structure.

Also, since the spots and stripes of the honeycomb shadow are created as the projection of junctures of the honeycomb grids overlap with each other or as the projection of grids overlap with each other in rows, so that these patterns can be observed by virtue of the differences in the intensity of the light (contrast ratio). We will explain this with reference to the dotted pattern in FIG. 3, which shows a shadow image of a pellicle having the same honeycomb mesh structure as the above EUV pellicle mentioned in [0031], as obtained by the simulator with the stand-off being 0.4 mm. In FIG. 3 a portion is enclosed by a white line, and the digital light intensity datum, which is an average of the values obtained at five points at several parts in the enclosed portion, are plotted and the graph of FIG. 5 was obtained.

The horizontal axis of the graph of FIG. 5 represents positions in the area enclosed by the white line of FIG. 3, measured from the top of the area downward, and the vertical axis represents light intensity. Incidentally, in the graph both actual data and smoothed data are plotted, but the actual data have such a large volatility that the smoothed data are adopted as the data for estimation. Also, since the upper and the lower extremities of the area tend to provide abnormal values owing to their discontinuity, the date from the extremities were removed from the estimation and the maximum value and the minimum value were determined from the remaining values; then the contrast ratio can be obtained quantitatively through the following equation, in which the ratio of minimum light intensity to maximum light intensity is taken into consideration.

$$\text{Contrast ratio} = (1 - [\text{minimum value}]/[\text{maximum value}]) \times 100$$

As a concrete example, from the profile of light intensity as plotted in FIG. 5, the values obtained at the extremities were removed and then the highest optical intensity value was taken as the maximum value and the lowest optical intensity value was taken as the minimum value, and they were introduced in the above equation to obtain respective contrast ratios in the cases of stand-off being 0.4 mm and 0.5 mm; the result was that when the stand-off was 0.4 mm the contrast ratio was 21.5% and when it was 0.5 mm the contrast ratio was 22.0%.

Similarly in the case of striped pattern of FIG. 4, it is possible to obtain the contrast ratio by means of a similar method. The contrast ratios in the cases of the stand-off being 0.7 mm and 0.8 mm were calculated and the results were compared; when the stand-off was 0.7 mm the contrast ratio was 7.2% and when it was 0.8 mm the contrast ratio was 9.1%.

It is a commonly shared thought that as the stand-off is increased the contrast would be weakened, and thus the effect of the shadow of the mesh structure would be attenuated; however, the above result obtained indicates that the reality is not necessarily as is expected. This unexpectedness is caused as the patterns such as the spotted pattern and the striped pattern, which are formed as the shadows of the mesh structure overlap each other in specific manners, bring about cyclic alteration to the contrast ratio.

Therefore, the present inventors came to discover that, based on the cyclic alteration of the contrast ratio attributable to the mesh structure, it is possible to weaken the effect of the image shadows of the mesh structure of the EUV pellicle if the stand-off of the mesh structure is so designed that the contrast ratio becomes lower.

The mesh structure cannot fail to affect the contrast ratio to a greater or less degree anyhow, but the present inventors also found that, as a method to control the local increase of the contrast ratio which occurs as darkened parts generated by a specific overlapping of the darker parts of the mesh structure especially when the light reaches the mask 3 and then reflected by the mask, it is possible to control the cyclic alteration of the contrast ratio by rotating the mesh structure while maintaining it in parallel with the mask.

Figure 10:
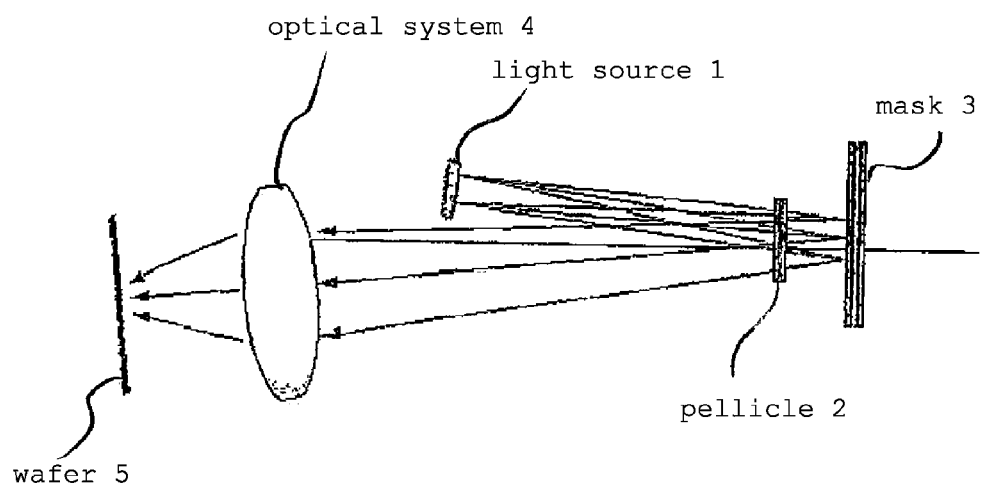
FIG. 10 shows a basic structure of a light exposure machine and light paths from the light source and the wafer.

Hence, when an assembly made up of an EUV pellicle 2 containing a mesh structure, etc. and a mask 3 having side lines is made, the mesh structure, as shown in FIG. 10, is aligned in the optical path in a manner such that the EUV light as it reflects upon a face of the mask 3 passes the EUV pellicle 2 twice and thus casts two kinds of image shadow on the wafer 5.

In this making of the assembly, it is a must in the present invention that the stand-off value of the pellicle 2 is of such a value as to allow the contrast ratio between the two kinds of image shadow of the mesh structure to be 25% or lower, and also a grid of said mesh structure ought to form an angle, in projection, of greater than 0 degree but not greater than 30 degrees with at least one side line of said mask.

It is a preferable option to bring the projected angle to a value whereat the contrast ratio becomes the minimum with respect to the stand-off; or more preferably, the stand-off and the projected angle are such that the contrast ratio becomes as low as it can be.

This phenomenon is explained with reference to FIG. 6, where the mesh structure has a honeycomb-like shape; in FIG. 6, the simulated image shadows are in the cases where the honeycomb angle is 0 degree, 15 degrees or 30 degrees, and the stand-off is 0.3 mm or 0.5 mm. Also, shown in the left part of FIG. 6 are honeycomb configurations in the cases where the honeycomb is positioned in the same manner as in FIG. 1, or it is horizontally rotated counterclockwise by 15 degrees from the FIG. 1 position, or it is horizontally rotated counterclockwise by 30 degrees from the FIG. 1 position.

It is apparent from FIG. 6 that when the honeycomb, which is the mesh structure, is rotated relative to the mask 3, the specific overlapping manner of the honeycomb grids undergoes alteration; hence in the case of stand-off being 0.5 mm, the contrast ratio was compared between the image shadow of the honeycomb when the projected honeycomb angle was 0 degree and that when the projected honeycomb angle was 30 degrees, and it was found that the contrast ratio was 22.0% when the projected honeycomb angle was 0 degree and it was 14.6% when the projected honeycomb angle was 30 degrees. From this result, it was confirmed that there occurs significant difference in the contrast ratio of the image shadow of the honeycomb depending on the projected honeycomb angle.

Therefore, in the case where the stand-off is unalterable due to the structure of the exposure machine, the pellicle structure, or the like, and if with that limited stand-off a local enhancement of contrast ratio occurs due to a specific overlapping of the mesh structure, it is possible to attenuate the contrast ratio of the image shadow by controlling the projected angular position of the mesh structure relative to the mask by moving the pellicle around.

As a mesh structure for reinforcement of the pellicle film for EUV, one can choose from various configurations besides the above-mentioned honeycomb-like structure so long as the intended purpose is met, such as lattice structure, a plate body having openings in an arbitrary shape such as circle and polygon. However, if a mesh structure has a part where six grids join together or a part where the density of the image is high, such parts bring about enhancement of the local contrast ratio, and thus such a mesh structure should be avoided.

The strength of the structure is determined by mesh pitch, width of the thin grid frame defining each mesh opening, and height (thickness) of the frame, and the strength of the structure is greater with narrower pitch, greater width of the grid frame and greater height (thickness) of the grid frame.

Figure 8:
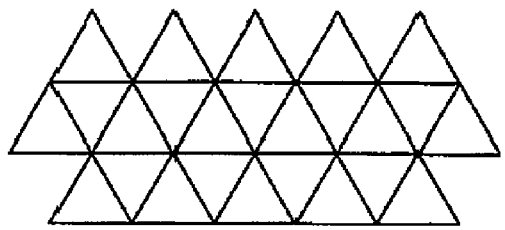
FIG. 8 shows a mesh structure of not favorable configuration.
Figure 9:
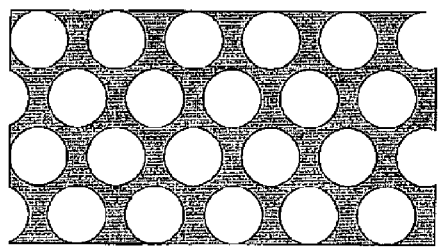
FIG. 9 shows a mesh structure of not favorable configuration.

For example, a mesh structure having a triangular unit as shown in FIG. 8 is not preferable because six grids necessarily join together. Also, a mesh structure which is made by punching off holes from a plate as in the case of FIG. 9 is not favorable because the grids tends to be facial rather than linear and as such they are more apt to overlap in their image shadow; on the contrary, a mesh structure where the unit is quadrilateral or regular hexagon is preferable.

EXAMPLES

We will now explain the present invention using an example. First, we prepared an SOI (Silicon On Insulator)

substrate, wherein a 100-nm-thick membrane consisting of a silicon single crystal (Nearly Perfect Crystal: NPC), which has virtually no crystalline defects such as COP (Crystal Originated Particle), is glued via a 100-nm-thick thermal silicon oxide film (SiO2) to a handle base plate, which has a diameter of 200 mm and a thickness of 725 micrometers.

After thinning the handle base plate of this SOI substrate to a thickness of 50 micrometers, a honeycomb structure pattern was impressed on the handle base plate side of the SOI substrate by lithographic patterning. Then by means of DRIE (Deep Reactive Ion Etching) a honeycomb structure was created wherein each honeycomb basic unit consisting of a hexagonal frame has its interior angles rounded and the honeycomb structure had a pitch of 200 micrometers, a honeycomb frame grid width of 3 micrometers, and a honeycomb frame height of 20 micrometers. Next, a film of BOX (Buried Oxide) was removed by HF treatment, and thus a pellicle film for EUV was completed; then this film was glued on an aluminum pellicle frame, and thus a pellicle for EUV was completed.

Next, by using Light Tools of Optical Research Associate, Inc., an exposure machine having a optical path which consists of a light source 1, a pellicle 2, a mask 3 with side lines, a projection optical system 4 and a wafer 5 was constructed, as shown in FIG. 10. Also, this exposure machine was set to have an NA of 0.33, an incident angle of 6 degrees, and an incident light diversion angle of 3.8 degrees; then, a pellicle membrane structure having a honeycomb structure wherein the pitch is 200 micrometers and mesh grid width is 3 micrometers was set in this exposure machine in a manner such that the honeycomb angle was 0 degree, 15 degrees and 30 degrees, respectively, and such that the stand-off was of predetermined respective values measured from the patternless mask 3, and the image data of the optical image on the wafer 5 were collected as digital data with respect to the respective stand-off values.

Figure 7:
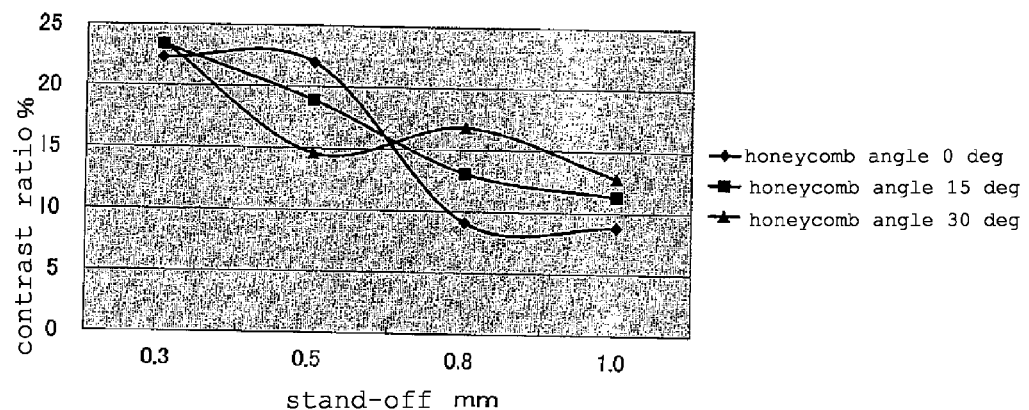
FIG. 7 is a graph plotting the relations between stand-off, image shadow contrast ratio, and honeycomb angle, according to the data in Table 1.

From these image data, the respective contrast ratios were calculated by the method as explained with regard to the example of FIG. 3. Table 2 shows resultant contrast ratios that were obtained with respect to respective projected honeycomb angles and stand-offs. FIG. 7 is a graph version of the results of Table 1.

TABLE 1

|  |  | stand-off value | | | |
| --- | --- | --- | --- | --- | --- |
|  |  | 0.3 mm | 0.5 mm | 0.8 mm | 1.0 mm |
| projected | 0 degree | 22.30% | 22.00% | 9.10% | 8.80% |
| honeycomb | 15 degrees | 23.40% | 18.90% | 13.10% | 11.30% |
| angle | 30 degrees | 23.50% | 14.60% | 16.80% | 12.80% |

It was confirmed from FIG. 7 and Table 1 that the contrast ratio changes as the projected honeycomb angle and the stand-off are altered. Also, in the cases of honeycomb angle being 0 or 15 degrees, it was found that the contrast ratio is reduced as the stand-off is increased; whereas in the case of projected honeycomb angle being 30 degrees, this tendency does not necessarily hold. Furthermore, when the stand-off is fixed at 0.3 mm, 0.8 mm or 1.0 mm, the tendency is that as the projected honeycomb angle is increased the contrast ratio also increases; however when the stand-off is fixed at 0.5 mm, this tendency does not necessarily hold, but it was confirmed that as the projected honeycomb angle is increased from 0 to 15 and then to 30 degrees, the contrast ratio undergoes a decrease.

From the above result, it is confirmed that the contrast ratio of the image shadow of the honeycomb structure depends on both the stand-off and the projected honeycomb angle, and thus it is important that the stand-off is determined to such a value beforehand that allows the contrast ratio of the image shadow to be 25% or lower.

In the case where the stand-off is restricted to certain values owing to the structure of the exposure machine, the structure of the pellicle, or the like, it is preferable that the projected honeycomb angle, that is the phase angle between the mesh structure and the mask face, is adjusted within a range of 0 to 30 degrees, so as to minimize the contrast ratio of the image shadow of the mesh structure at those stand-off values; furthermore, it is more preferable that a combination of the stand-off value and the projected honeycomb angle that brings about the minimum contrast ratio is adopted.

REPRESENTATION OF REFERENCE NUMERALS

1: light source
2: pellicle
3: mask with side lines
4: optical system
5: wafer

What is claimed is:

1. A pellicle for EUV which comprises: (i) a pellicle membrane structure having a pellicle membrane and a mesh structure, the latter reinforcing the former, and (ii) a pellicle frame for holding the pellicle membrane structure, the mesh structure being disposed to be projected in two kinds of image shadow on a wafer on account of EUV light's passing the EUV pellicle twice as it approaches and reflects on a pattern-carrying face of a mask; wherein a stand-off of the pellicle is of such a value as to allow the contrast ratio between the two kinds of image shadow of the mesh structure to be 25% or lower.

2. A pellicle for EUV as claimed in claim 1, wherein said stand-off is 0.3 through 1.0 mm.

3. An assembly combining a mask having side lines and a pellicle for EUV which latter comprises: (i) a pellicle membrane structure having a pellicle membrane and a mesh structure, the latter reinforcing the former, and (ii) a pellicle frame for holding the pellicle membrane structure, the mesh structure being disposed to be projected in two kinds of image shadow on a wafer on account of EUV light's passing the EUV pellicle twice as it approaches and reflects on a pattern-carrying face of the mask; wherein a stand-off of the pellicle is of such a value as to allow the contrast ratio between the two kinds of image shadow of the mesh structure to be 25% or lower and wherein a grid of said mesh structure forms an angle, in projection, of greater than 0 degree but not greater than 30 degrees with at least one side line of said mask.

4. An assembly as claimed in claim 3, wherein said angle is such that the resultant contrast ratio becomes a minimum with respect to said stand-off.

5. An assembly as claimed in claim 3, wherein said stand-off and said angle are selected such that the resultant contrast ratio becomes a minimum.

6. An assembly as claimed in claim 3, wherein said mesh structure has a quadrilateral or hexagonal mesh unit.

7. A method for assembling an assembly of a mask having side lines and a pellicle for EUV which latter comprises: (i) a pellicle membrane structure having a pellicle membrane and a mesh structure, the latter reinforcing the former, and (ii) a pellicle frame for holding the pellicle membrane structure, the mesh structure being disposed to be projected in two kinds of image shadow on a wafer on account of EUV light's passing the EUV pellicle twice as it approaches and reflects on a pattern-carrying face of the mask; said method comprising steps of (a) providing such a stand-off to said pellicle that allows the contrast ratio between the two kinds of image shadow of the mesh structure to be 25% or lower and (b) moving said pellicle relative to said mask until a grid of said mesh structure forms an angle, in projection, of greater than 0 but not greater than 30 degrees, with at least one side line of said mask whereat said contrast ratio becomes minimum.

\* \* \* \* \*